United States Patent
Wang et al.

(10) Patent No.: US 10,984,700 B1
(45) Date of Patent: Apr. 20, 2021

(54) SHIFT REGISTER UNIT, SHIFT REGISTER CIRCUIT AND DRIVING METHOD, AND DISPLAY PANEL

(71) Applicants: BOE TECHNOLOGY GROUP CO., LTD., Beijing (CN); Hefei Xinsheng Optoelectronics Technology Co., Ltd., Anhui (CN)

(72) Inventors: Fei Wang, Beijing (CN); Xiaofang Gu, Beijing (CN); Tingting Zhao, Beijing (CN); Xiaoye Ma, Beijing (CN); Rui Ma, Beijing (CN)

(73) Assignees: BOE Technology Group Co., Ltd., Beijing (CN); Hefei Xinsheng Optoelectronics Technology Co., Ltd., Anhui (CN)

(*) Notice: Subject to any disclaimer, the term of this patent is extended or adjusted under 35 U.S.C. 154(b) by 503 days.

(21) Appl. No.: 16/075,119

(22) PCT Filed: Nov. 15, 2017

(86) PCT No.: PCT/CN2017/111097
§ 371 (c)(1),
(2) Date: Aug. 2, 2018

(87) PCT Pub. No.: WO2018/205535
PCT Pub. Date: Nov. 15, 2018

(30) Foreign Application Priority Data

May 9, 2017 (CN) .......................... 201710321958.4

(51) Int. Cl.
*G09G 3/36* (2006.01)
*G09G 3/20* (2006.01)
*G11C 19/28* (2006.01)

(52) U.S. Cl.
CPC ........... *G09G 3/2092* (2013.01); *G11C 19/28* (2013.01); *G09G 2310/0278* (2013.01); *G09G 2310/0286* (2013.01)

(58) Field of Classification Search
CPC . G09G 3/36; G09G 3/20; G11C 19/28; G02F 1/1345; G06F 3/038
See application file for complete search history.

(56) References Cited

U.S. PATENT DOCUMENTS 7,023,410 B2 * 4/2006 Lee ...................... G09G 3/3648
345/87
7,319,452 B2 1/2008 Moon
(Continued)

FOREIGN PATENT DOCUMENTS

CN 204102544 U 1/2015
CN 106023945 A 10/2016
(Continued)

OTHER PUBLICATIONS

International Search Report and Written Opinion dated Feb. 14, 2018, for application No. PCT/CN2017/111097.

*Primary Examiner* — Pegeman Karimi
(74) *Attorney, Agent, or Firm* — Arch & Lake LLP

(57) ABSTRACT

A shift register unit includes: an input circuit, a reset circuit, and an output circuit; a first pull-down control circuit, configured to transmit the first power signal to the first and second pull-down control nodes, and the pull-down node according to the pull-up node, a second pull-down control circuit, configured to transmit a second power signal to the first pull-down control node according to the second power signal, transmit the second power signal to the second pull-down control node according to the first pull-down control node, and transmit the second power signal to the pull-down node according to the second pull-down control node, and a pull-down circuit, configured to transmit the first
(Continued)

power signal to the pull-up node and the signal output end according to the pull-down node. The present disclosure may ensure the normal output of the signal and improve the ability of reducing noise.

13 Claims, 5 Drawing Sheets

(56) References Cited

U.S. PATENT DOCUMENTS

| | | | |
|---|---|---|---|
| 8,564,523 B2 * | 10/2013 | Moon | G09G 3/3677 345/100 |
| 9,293,093 B2 | 3/2016 | Kim et al. | |
| 9,378,696 B2 * | 6/2016 | Yao | G09G 3/3677 |
| 2004/0189585 A1 | 9/2004 | Moon | |
| 2011/0058642 A1 * | 3/2011 | Tsai | G11C 19/28 377/79 |
| 2014/0176410 A1 * | 6/2014 | Ma | H03K 3/012 345/92 |
| 2015/0077407 A1 | 3/2015 | Kim et al. | |
| 2018/0144677 A1 * | 5/2018 | Zhang | G09G 3/2092 |

FOREIGN PATENT DOCUMENTS

| | | |
|---|---|---|
| CN | 106409213 A | 2/2017 |
| CN | 106935206 A | 7/2017 |

* cited by examiner

US 10,984,700 B1

SHIFT REGISTER UNIT, SHIFT REGISTER CIRCUIT AND DRIVING METHOD, AND DISPLAY PANEL

CROSS REFERENCE

The present application is based upon International Application No. PCT/CN2017/111097, filed on Nov. 15, 2017, which is based upon and claims priority to Chinese Patent Application No. 201710321958.4, filed on May 9, 2017, and the entire contents thereof are incorporated herein by reference.

TECHNICAL FIELD

The present disclosure relates to the field of display technology, in particular, to a shift register unit, a shift register circuit and driving method, and a display panel.

BACKGROUND

With the development of optical technology and semiconductor technology, flat panel displays represented by liquid crystal displays (LCDs) and organic light emitting diodes (OLEDs) dominate the display field as they are slim and having low energy consumption, fast response, high color purity and high contrast ratio. In recent years, display devices have shown a trend of high integration and low cost. Represented by the Gate Driver on Array (GOA) technology, which is used to integrate the gate drive circuit into the peripheral area of the array substrate, thus reducing the manufacturing cost of the display device while achieving a narrow bezel design.

It should be noted that, information disclosed in the above background portion is provided only for better understanding of the background of the present disclosure, and thus it may contain information that does not form the prior art known by those ordinary skilled in the art.

SUMMARY

According to one aspect, the present disclosure provides a shift register.

The shift register includes an input circuit, connected to a signal input end and a pull-up node, and configured to transmit an input signal to the pull-up node under control of the signal input end.

The shift register further includes a reset circuit, connected to a reset signal end, a first power signal end, and the pull-up node, and configured to transmit a first power signal to the pull-up node under control of the reset signal end.

The shift register further includes an output circuit, connected to the pull-up node, a clock signal end, and a signal output end, and configured to transmit a clock signal to the signal output end under control of the pull-up node.

The shift register further includes a first pull-down control circuit, connected to the pull-up node, the first power signal end, a first pull-down control node, a second pull-down control node, and a pull-down node, and configured to respectively transmit the first power signal to the first pull-down control node, the second pull-down control node, and the pull-down node, under control of the pull-up node.

The shift register further includes a second pull-down control circuit, connected to a second power signal end, the first pull-down control node, the second pull-down control node, and the pull-down node, and configured to transmit a second power signal to the first pull-down control node under control of the second power signal end, transmit the second power signal to the second pull-down control node under control of the first pull-down control node, and transmit the second power signal to the pull-down node under control of the second pull-down control node.

The shift register further includes a pull-down circuit, connected to the pull-down node, the first power signal end, the pull-up node, and the signal output end, and configured to respectively transmit the first power signal to the pull-up node and the signal output end under control of the pull-down node.

In an exemplary arrangement of the present disclosure, the input circuit is described to include a first switching element, having a control end and a first end connected to the signal input end, and a second end connected to the pull-up node.

In an exemplary arrangement of the present disclosure, the reset circuit includes a second switching element, having a control end connected to the reset signal end, a first end connected to the first power signal end, and a second end connected to the pull-up node.

In an exemplary arrangement of the present disclosure, the output circuit includes a third switching element having a control end connected to the pull-up node, a first end connected to the clock signal end, and a second end connected to the signal output end, and a storage capacitor coupled between the pull-up node and the signal output end.

In an exemplary arrangement of the present disclosure, the first pull-down control circuit includes a fourth switching element having a control end connected to the pull-up node, a first end connected to the first power signal end, and a second end connected to the first pull-down control node, a fifth switching element having a control end connected to the pull-up node, a first end connected to the first power signal end, and a second end connected to the second pull-down control node, and a sixth switching element having a control end connected to the pull-up node, a first end connected to the first power signal end, and a second end connected to the pull-down node.

In an exemplary arrangement of the present disclosure, the second pull-down control circuit includes a seventh switching element having a control end and a first end connected to the second power signal end, and a second end connected to the first pull-down control node, an eighth switching element having a control end connected to the first pull-down control node, a first end connected to the second power signal end, and a second end connected to the second pull-down control node, a ninth switching element having a control end connected to the second pull-down control node, a first end connected to the second power signal end, and a second end connected to the pull-down node.

In an exemplary arrangement of the present disclosure, the pull-down circuit includes a tenth switching element having a control end connected to the pull-down node, a first end connected to the first power signal end, and a second end connected to the pull-up node, an eleventh switching element having a control end connected to the pull-down node, a first end connected to the first power signal end, and a second end connected to the signal output end.

In an exemplary arrangement of the present disclosure, each of the switching elements is an N-type transistor or each of the switching elements is a P-type transistor.

In an exemplary arrangement of the present disclosure, a level of the second power signal is higher than those of other signals.

According to an aspect, the present disclosure provides a shift register circuit including a plurality of cascaded shift register units described above.

The signal output end of the (M−1)-th stage shift register unit is connected to the signal input end of the M-th stage shift register unit.

The signal output end of the (M+1)-th stage shift register unit is connected to the reset signal end of the M-th stage shift register unit.

According to an aspect, the present disclosure provides a display panel including a display area and a peripheral area. The peripheral area being provided with the shift register circuit described above.

In an exemplary arrangement of the present disclosure, the display panel further includes a plurality of gate lines extending in a first direction and a plurality of data lines extending in a second direction intersecting the first direction, and a plurality of pixel units defined by the gate lines and the data lines.

The gate line is configured to transmit a scan signal provided by the shift register circuit, and the data line is configured to transmit a data signal provided by a source driver.

According to an aspect, the present disclosure provides a driving method for driving the shift register circuit described above.

The driving method includes, in a charging phase, the input circuit is controlled to be turned on by the input signal to transmit the input signal to the pull-up node, and the first pull-down control circuit is controlled to be turned on by the pull-up node to respectively transmit the first power signal to the first pull-down control node, the second pull-down control node, and the pull-down node, in an output stage, the first pull-down control circuit and the output circuit are controlled to be turned on by the pull-up node to respectively transmit the first power supply signal to the first pull-down control node, the second pull-down control node, and the pull-down node, and transmitting the clock signal to the signal output end, in a discharging phase, the first pull-down control circuit is controlled to be turned on by the pull-up node to maintain voltages of the first pull-down control node, the second pull-down control node, and the pull-down node, and in a reset phase, the reset circuit is controlled to be turned on by the reset signal to transmit the first power signal to the pull-up node, and the second pull-down control circuit is controlled to be turned on by the second power signal to respectively transmit the second power signal to the first pull-down control node, the second pull-down control node, and the pull-down node, and controlling the pull-down circuit to be turned on by the pull-down node to respectively transmit the first power signal to the pull-up node and the signal output end.

It is to be understood that both the foregoing general description and the following detailed description are exemplary and explanatory only and are not restrictive of the arrangements, as claimed.

This section provides a summary of various implementations or examples of the technology described in the disclosure, and are not a comprehensive disclosure of the full scope or all features of the disclosed technology.

BRIEF DESCRIPTION OF THE DRAWINGS

The accompanying drawings are enclosed to provide a further understanding of the present disclosure and constitute a part of the specification, and together with the following detailed description, to serve for explanation of the present disclosure. It will be apparent that the drawings in the following description refer only to some arrangements of the present disclosure, other drawings are available to those of ordinary skill in the art without any creative work.

DETAILED DESCRIPTION

Figure 1:
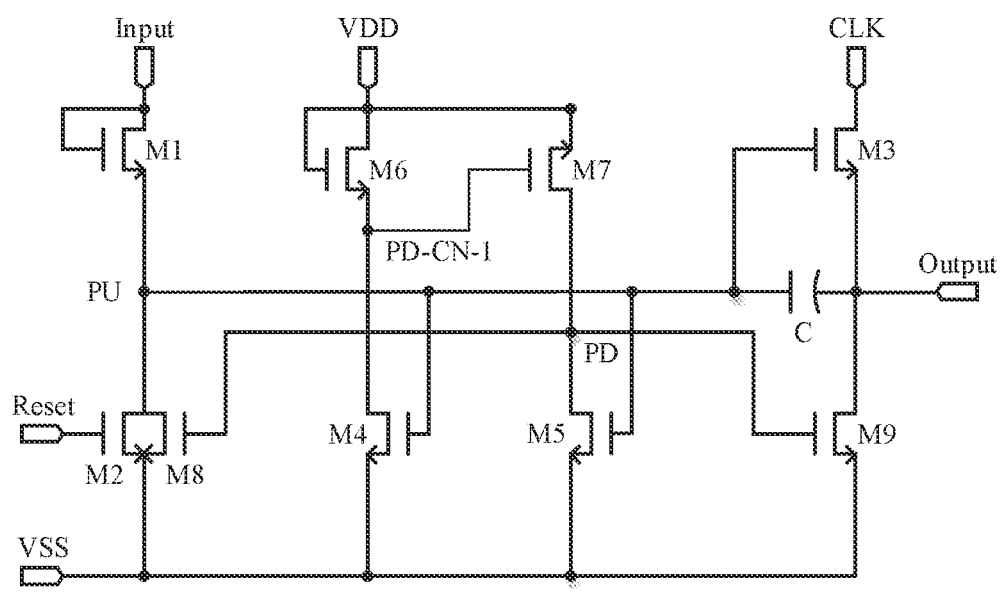
FIG. 1 schematically shows a schematic diagram of a GOA circuit in accordance with an example of the present disclosure.

Example arrangements will now be described more fully with reference to the accompanying drawings. However, the example arrangements can be embodied in a variety of forms and should not be construed as being limited to the examples set forth herein; rather, these arrangements are provided so that this disclosure will be more fully and complete, and will fully convey the concept of the example arrangements to those skilled in the art. The described features, structures, or characteristics may be combined in any suitable manner in one or more arrangements.

Further, the drawings are only schematic representations of the disclosure, and are not necessarily drawn to scale. The same reference numerals in the drawings denote the same or similar parts, and thus the repeated description thereof will be omitted. Some of the block diagrams shown in the figures are functional entities and do not necessarily have to correspond to physically or logically independent entities. These functional entities may be implemented in software, or implemented in one or more hardware modules, circuits, or integrated circuits, or implemented in different network and/or processor devices and/or microcontroller devices.

Figure 2:
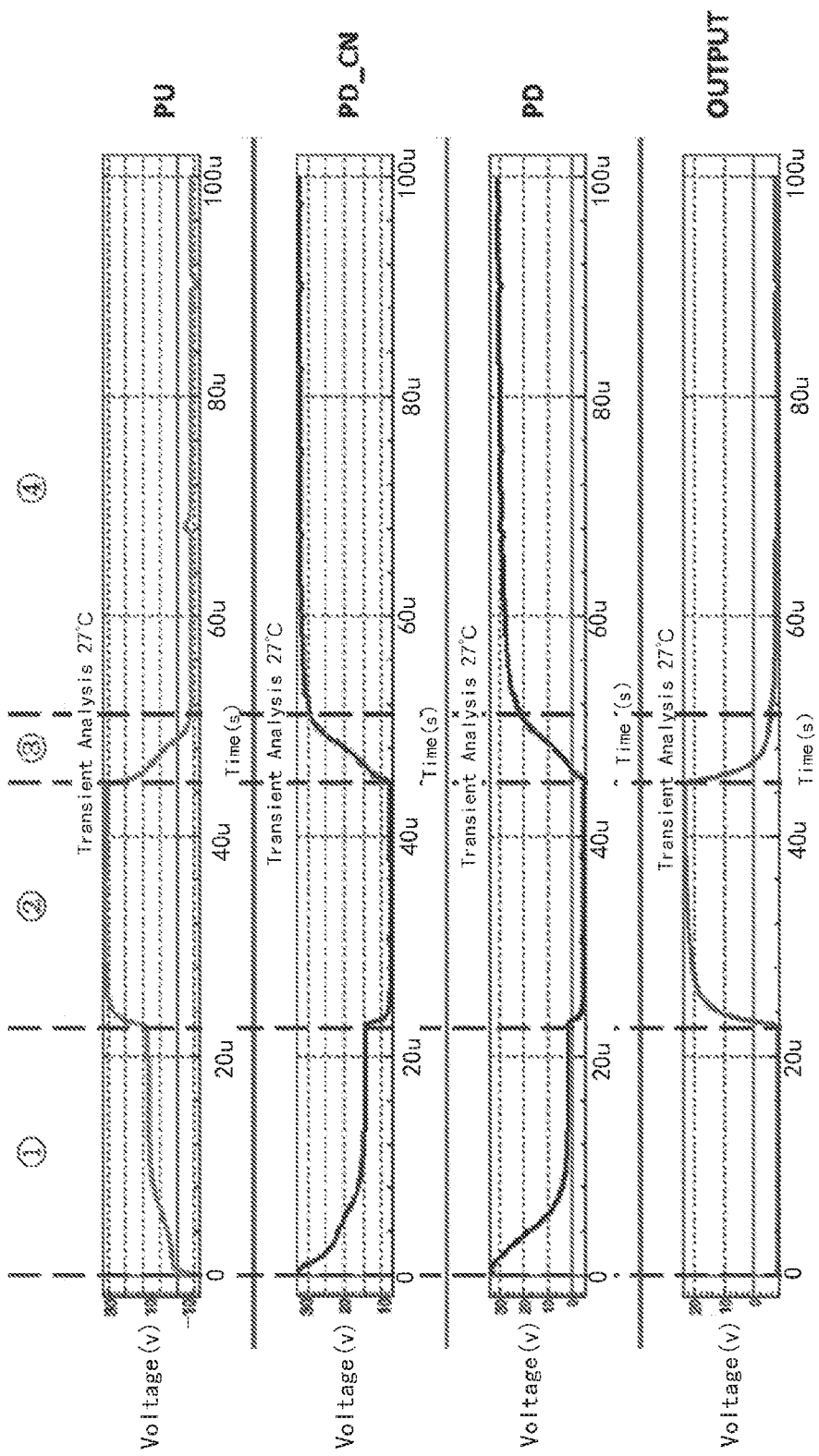
FIG. 2 schematically shows an analog waveform diagram of the GOA circuit of FIG. 1.

FIG. 1 schematically shows a schematic diagram of a GOA circuit in accordance with an example of the present disclosure. In this arrangement, the eighth transistor M8 and the ninth transistor M9 constitute a noise reduction processing unit for performing noise reduction processing under the control of the pull-down node PD, and the higher the level of the pull-down node PD is, the better the noise reduction processing effect will be. The level of the pull-down node PD is controlled by the pull-up node PU. Specifically, when the pull-up node PU is at a high level, the fourth transistor M4 and the fifth transistor M5 are fully turned on, and the pull-down control node PD-CN and the pull-down node PD are pulled down to a low level by the influence of the first power supply voltage VSS, and the seventh transistor M7 is turned off under the control of the pull-down control node PD-CN, so the pull-down node PD remains at a low level. In order to achieve a better noise reduction effect, it is necessary to increase the level of the pull-down node PD during noise reduction, which in particular can be achieved by increasing the level of the second power supply voltage VDD. However, the level of the second power supply voltage VDD being too high causes the sixth transistor M6 to be sufficiently turned on, so that the level of the pull-down control node PD-CN rises accordingly, so that the seventh transistor M7 is turned on, eventually increasing the level of the pull-down node PD. Referring to FIG. 2, when the pull-up node PU is set high, the pull-down node PD should be kept low, but under the excessive level of the second power supply voltage VDD, the level of the pull-down node PD is abnormally increased, thus causing an abnormal output waveform of the GOA circuit, and the GOA circuit cannot be reset normally and has higher noise.

Figure 3:
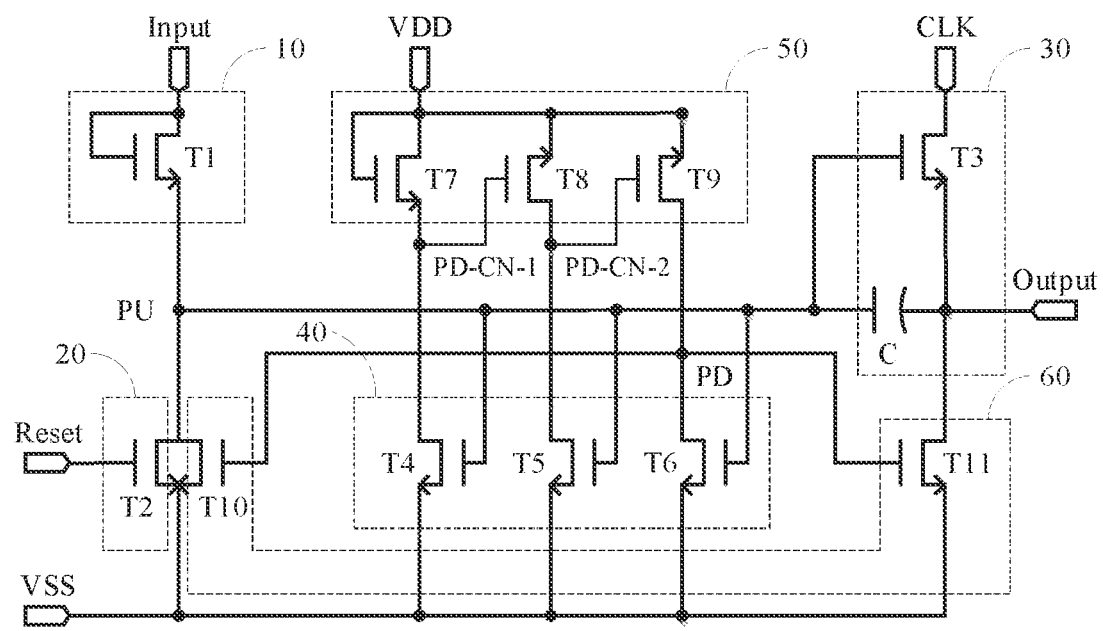
FIG. 3 schematically shows structural diagram of a shift register unit in an exemplary arrangement of the present disclosure.

The present example arrangement proposes a shift register unit that can improve the noise reduction capability of the shift register circuit. As shown in FIG. 3, the shift register unit may include the followings.

The input circuit 10 is connected to the signal input end Input and the pull-up node PU for transmitting the input signal of the signal input end Input to the pull-up node PU under the control of the signal input end Input.

The reset circuit 20 is connected to the reset signal end Reset, the first power signal end VSS and the pull-up node PU for transmitting the first power signal of the first power signal end VSS to the pull-up node PU under the control of the reset signal end Reset.

The output circuit 30 is connected to the pull-up node PU, the clock signal end CLK and the signal output end Output for transmitting the clock signal of the clock signal end CLK to the signal output end Output under the control of the pull-up node PU.

The first pull-down control circuit 40 is connected to the pull-up node PU, the first power signal end VSS, the first pull-down control node PD-CN-1, the second pull-down control node PD-CN-2, and the pull-down node PD, for respectively transmitting the first power signal of the first power signal end VSS to the first pull-down control node PD-CN-1, the second pull-down control node PD-CN-2, and the pull-down node PD under the control of the pull-up node PU.

The second pull-down control circuit 50 is connected to the second power signal end VDD, the first pull-down control node PD-CN-1, the second pull-down control node PD-CN-2, and the pull-down node PD, for respectively transmitting the second power signal of the second power signal end VDD to the first pull-down control node PD-CN-1, the second pull-down control node PD-CN-2, and the pull-down node PD under the control of the power signal end VDD.

The pull-down circuit 60 is connected to the pull-down node PD, the first power signal end VSS, the pull-up node PU, and the signal output end Output, for respectively transmitting the first power signal of the first power signal end VSS to the pull-up node PU and the signal output Output under the control of the pull-down node PD.

In the arrangement, the first power signal may be a low level signal, and the second power signal may be a high level signal.

It should be noted that in order to increase the level of the pull-down node PD during the noise reduction process, the second power signal is set to a higher voltage with respect to the normal high level. For example, the normal high level (i e, the high level of other signals such as the clock signal CLK) is set at about 24V, and the second power signal in this arrangement is set at about 33V.

In the shift register unit provided by the exemplary arrangement of the present disclosure, a pull-down control node is added to the conventional shift register unit, and the control of the levels of the first pull-down control node PD-CN-1, the second pull-down control node PD-CN-2, and the pull-down node PD are controlled by the combined action of the first pull-down control circuit 40 and the second pull-down control circuit 50. In this way, when the pull-up node PU is at a low level, the function of the first pull-down control circuit 40 can be turned off, and the levels of the first pull-down control node PD-CN-1, the second pull-down control node PD-CN-2, and the pull-down node PD are sufficiently raised by the second pull-down control circuit 50, such that the level of the pull-down node PD is sufficiently high when the pull-up node PU is at a low level, thus improving the noise reduction effect; and when the pull-up node PU is at a high level, the levels of the first pull-down control node PD-CN-1, the second pull-down control node PD-CN-2, and the pull-down node PD can be pulled down by the first pull-down control circuit 40, and at the same time, since the second pull-down control circuit 50 implements the control of the levels of the first pull-down control node PD-CN-1, the second pull-down control node PD-CN-2, and the pull-down node PD step by step, the pull-down node PD at the most downstream is least affected by the second power signal, so the low level of the pull-down node OD can be kept from being pulled up. That is, the level of the pull-down node PD is kept low enough when the pull-up node PU is set high, thus preventing an abnormal output of the shift register unit. Based on this, the shift register unit provided by the present disclosure can ensure that the level of the pull-down node PD is sufficiently high when the pull-up node PU is set low, and the level of the pull-down node PD is sufficiently low when the pull-up node PU is set high, thus ensuring the normal output of the signal and improving the ability of reducing noise.

The shift register unit provided based on the present exemplary arrangement may operate in the following stages.

S1, in the charging phase, the input circuit 10 is controlled by the input signal of the signal input end Input to be turned on to transmit the input signal to the pull-up node PU, and the first pull-down control circuit 40 is controlled to be turned on by the pull-up node PU to respectively transmit the first power signal of the first power signal end VSS to the first pull-down control node PD-CN-1, the second pull-down control node PD-CN-2, and the pull-down node PD.

In the arrangement, the input signal of the shift register unit of the current stage may be an output signal of the shift register unit of the previous stage, and when the shift register unit of the current stage is the first stage shift register unit, an initial signal STV may be used as the input signal.

In this phase, the pull-up node PU can be charged to gradually rise to a high level, and the level of the pull-down node PD can also be pulled down by the first pull-down control circuit 40 to prevent it from affecting the level of the pull-up node PU.

S2, in the output phase, the first pull-down control circuit 40 and the output circuit 30 are controlled to be turned on by the pull-up node PU to transmit the first power signal of the first power signal end VSS to the first pull-down control node PD-CN-1, the second pull-down control node PD-CN-2, and the pull-down node PD, and transmit the clock signal of the clock signal end CLK to the signal output end Output.

In the arrangement, the output signal of the shift register unit of the current stage can be provided to the scan line as a scan signal of the pixels.

In this phase, the pull-up node PU is kept at a high level, and at the same time as the signal output is realized, the level of the pull-down node PD is pulled down by the first pull-down control circuit 40 to prevent it from affecting the output signal of the signal output end Output.

S3, in the discharging phase, the first pull-down control circuit 40 is controlled to be turned on by the pull-up node PU to maintain the levels of the first pull-down control node PD-CN-1, the second pull-down control node PD-CN-2, and the pull-down node PD.

This phase is a discharge phase after the signal output phase is completed, and at this time, the pull-up node PU is at a half-high level, the signal output end Output and the clock signal end CLK have the same level, and the level of the pull-down node PD is still at the low state.

In this arrangement, since the level of the second power signal of the second power signal end VDD is higher than the level of the normal high level, the level of the first pull-down control node PD-CN-1 is inevitably pulled up. Therefore, the level of the second pull-down control node PD-CN-2 is also affected, thus affecting the pull-down node PD. However, since the level of the second pull-down control node PD-CN-2 is less affected than the level of the first pull-down control node PD-CN-1, and the level of the pull-down node PD is also less affected than the level of the second pull-down control node PD-CN-2, the influence of the second power signal on the pull-down node PD is relatively low and negligible by this step-by-step control relationship, thus ensuring that the level of the pull-down node PD does not rise abnormally during the discharge phase. More specifically, referring to FIG. 3, due to the voltage division of the fourth transistor T4 and the seventh transistor T7, the level of the node PD-CN-1 will be higher than the level of the first power signal end VSS and lower than the level of the second power signal end VDD. Therefore, the open degree of the eighth transistor T8 will be smaller than that of the seventh transistor T7, that is, the eighth transistor T8 has a larger resistance. Therefore, under the partial pressure of the eighth transistor T8 and the fifth transistor T5, the level of the node PD-CD-2 will be closer to the level of the first signal source VSS. Further, under a similar action, the open degree of the ninth transistor T9 is lower, so that the level of the pull-down node PD is closer to the level of the first power supply signal VSS, so that the influence of the second power supply signal VDD on the pull-down node PD is negligible, thus ensuring that the level of the pull-down node PD does not rise abnormally during this discharge phase.

S4, in the reset phase, the reset circuit 20 is controlled to be turned on by the reset signal of the reset signal end Reset to transmit the first power signal of the first power signal end VSS to the pull-up node PU; the second pull-down control circuit 50 to be turned on by the second power supply signal of the second power signal end VDD to transmit the second power signal of the second power signal end VDD to the first pull-down control node PD-CN-1 and the second pull-down control node PD-CN-2, and the pull-down node PD, respectively; and the pull-down circuit 60 is controlled to be turned on by the pull-down node PD to transmit the first power signal of the first power signal end VSS to the pull-up node PU and the signal output end Output, respectively.

In the arrangement, the reset signal of the shift register unit of the current stage may be an output signal of the shift register unit of the next stage.

In this phase, the level of the pull-up node PU can be pulled down and the level of the pull-down node PD can be pulled up, and the pull-up node PU and the signal output end Output are continuously discharged by the pull-down circuit 60. Since the levels of the second power signal of the second power signal end VDD and the pull-down node PD are the same, and the level of the second power signal is relatively high, the noise reduction effect of the arrangement is significantly improved.

The shift register unit in the present exemplary arrangement will be described in detail below with reference to FIG. 3.

The input circuit 10 may include a first switching element T1 having a control end and a first end connected to the signal input end Input and a second end connected to the pull-up node PU.

The reset circuit 20 may include a second switching element T2 having a control end connected to the reset signal end Reset, a first end connected to the first power signal end VSS, and a second end connected to the pull-up node PU.

The output circuit 30 may include: a third switching element T3 having a control end connected to the pull-up node PU, a first end connected to the clock signal end CLK, a second end connected to the signal output end Output, and a storage capacitor C connected between the pull-up node PU and the signal output end Output.

The first pull-down control circuit 40 may include: a fourth switching element T4 having a control end connected to the pull-up node PU, a first end connected to the first power signal end VSS, and a second end connected to the first pull-down control node PD-CN-1; a fifth switching element T5 having a control end connected to the pull-up node PU, a first end connected to the first power signal end VSS, and a second end connected to the second pull-down control node PD-CN-2; and a sixth switching element T6 having a control end connected to the pull-up node PU, a first end connected to the first power signal end VSS, and a second end connected to the pull-down node PD.

The second pull-down control circuit 50 may include: a seventh switching element T7 having a control end and a first end connected to the second power signal end VDD, and a second end connected to the first pull-down control node PD-CN-1; an eighth switching element T8 having a control end connected to the first pull-down control node PD-CN-1, a first end connected to the second power signal end VDD, and a second end connected to the second pull-down control node PD-CN-2; and a ninth switching element T9 having a control end connected to the second pull-down control node PD-CN-2, a first end connected to the second power signal end VDD, and a second end connected to the pull-down node PD.

The pull-down circuit 60 may include: a tenth switching element T10 having a control end connected to the pull-down node PD, a first end connected to the first power signal end VSS, and a second end connected to the pull-up node PU; and a eleventh switching element T11 having a control end connected to the pull-down node PD, a first end connected to the first power signal end VSS, and a second end connected to the signal output end Output.

In the exemplary arrangement, all of the switching elements may be MOS (Metal Oxide Semiconductor) field effect transistors, which may all adopt P-type MOS transistors or all adopt N-type MOS transistors. It should be noted that for different transistor types, the level signals of the respective signal ends will be correspondingly adjusted and changed.

In addition, in the arrangement shown in FIG. 3, the first pull-down control circuit 40 and the second pull-down control circuit 50 respectively include three switching elements, but the present disclosure is not limited thereto. In the arrangement of the present disclosure, the first pull-down control circuit 40 and the second pull-down control circuit 50 may each include other numbers of switching elements, and accordingly the shift register unit may have other numbers of pull-down control nodes. For example, to further reduce the influence of the second power signal end VDD on the pull-down node PD, the first pull-down control circuit 40 and the second pull-down control circuit 50 may respectively include four or more switching elements, such that the second pull-down control circuit 50 may control the levels of the first pull-down control node PD-CN-1, the second pull-down control nodes PD-CN-2, . . . , and the pull-down node PD by four or more stages.

Figure 4:
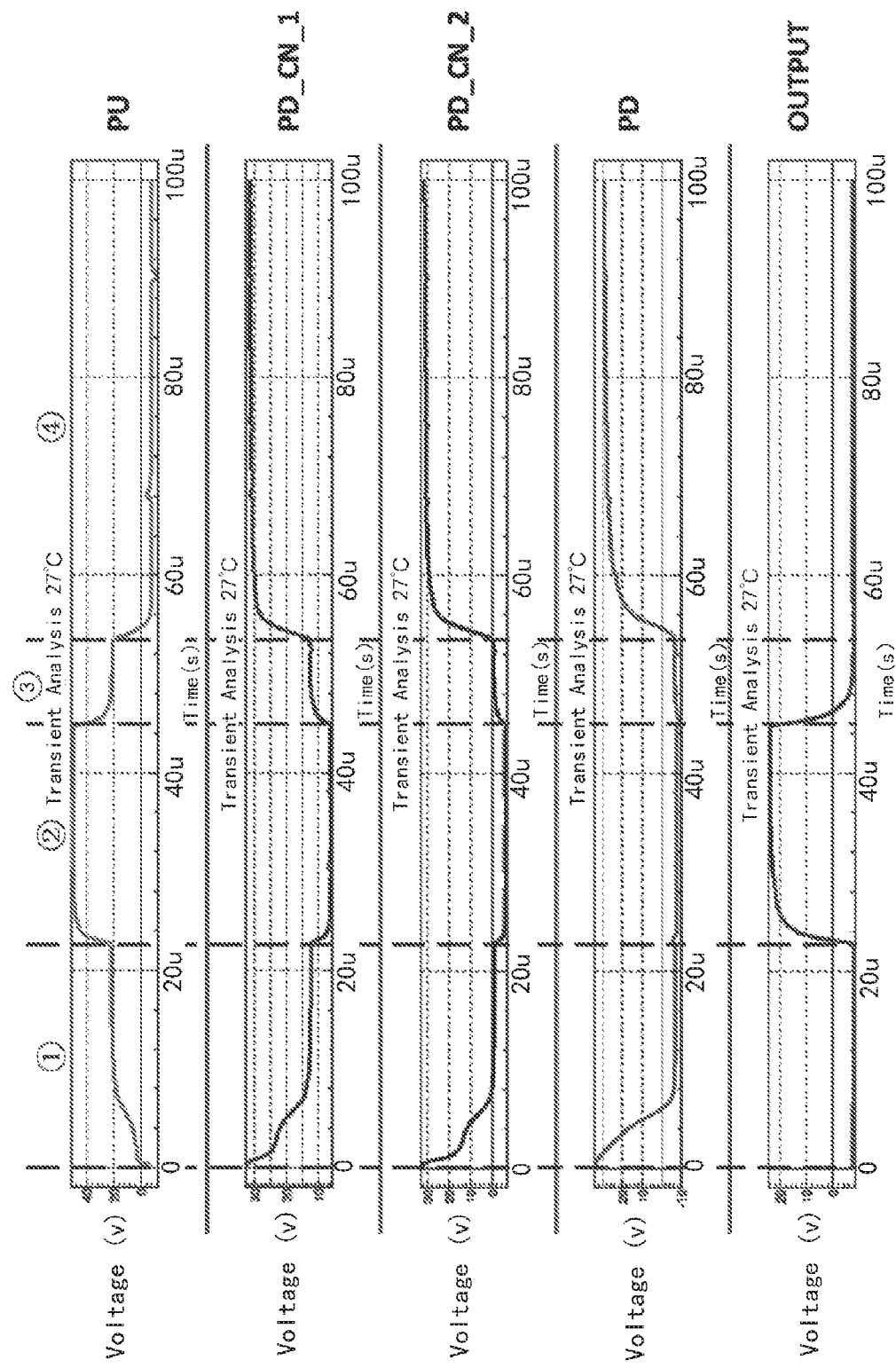
FIG. 4 schematically shows an analog waveform diagram of a shift register circuit in an exemplary arrangement of the present disclosure.

Based on the above configuration, the operation principle of the shift register unit in this arrangement will be specifically described with reference to the waveform diagram shown in FIG. 4, taking all the switching elements as NMOS as an example. The first power signal of the first power signal end VSS is a low level signal, and the second power signal of the second power signal end VDD is a high level signal.

The operating process of the shift register circuit may include the followings.

In the phase t1, the input signal of the signal input end is at a high level, the first switching element T1 is turned on, and the input signal is transmitted to the pull-up node PU and the storage capacitor C is charged, then the pull-up node PU is at a high level. The fourth switching element T4, the fifth switching element T5 and the sixth switching element T6 are turned on by the high level of the pull-up node PU, thus respectively transmitting the first power signal of the first power signal end VSS to the first pull-down The control node PD-CN-1, the second pull-down control node PD-CN-2, and the pull-down node PD, to ensure that the pull-down node PD is at a low level.

In the phase t2, the pull-up node PU is kept at a high level by the storage capacitor C, and the fourth switching element T4, the fifth switching element T5, and the sixth switching element T6 are turned on, respectively, and the first power supply signal end VSS is respectively A power signal is transmitted to the first pull-down control node PD-CN-1, the second pull-down control node PD-CN-2, and the pull-down node PD, thus ensuring that the pull-down node PD is at a low level. Meanwhile, the clock signal of the clock signal end CLK is at a high level, the third switching element T3 is turned on under the high level of the pull-up node PU, and the clock signal is transmitted to the signal output end Output, thus outputting a high level signal.

In the t3 phase, the clock signal of the clock signal end CLK is at a low level, and the pull-up node PU is at a half-high level, at which time the third switching element T3 is still turned on, and the level of the signal output end Output is equal to the low level of the clock signal. The fourth switching element T4, the fifth switching element T5 and the sixth switching element T6 are still turned on by the pull-up node PU, and the levels of the first pull-down control node PD-CN-1, the second pull-down control node PD-CN-2 and the pull-down node PD are still pulled low.

In the t4 phase, the reset signal of the reset signal end Reset is at a high level, the second switching element T2 is turned on, and the first power signal of the first power signal end VSS is transmitted to the pull-up node PU to pull down the level of the pull-up node PU. Accordingly, the fourth switching element T4, the fifth switching element T5 and the sixth switching element T6 are all turned off. At this time, under the action of the second power signal of the second power signal end VDD, the seventh switching element T7 is turned on to transmit the second power signal to the first pull-down control node PD-CN-1, such that the first pull-down control node PD-CN-1 is at a high level. Accordingly, the eighth switching element T8 is turned on, and the second power signal is transmitted to the second pull-down control node PD-CN-2, such that the second pull-down control node PD-CN-2 is at a high level. Accordingly, the ninth switching element T9 is turned on, and the second power signal is transmitted to the pull-down node PD, so that the pull-down node PD is at a high level. At this time, under the action of the pull-down node PD, the tenth switching element T10 and the eleventh switching element T11 are turned on, and the levels of the pull-up node PU and the signal output end Output are pulled down by the first power signal of the first power signal end VSS.

In the present exemplary arrangement, since the level of the second power signal of the second power signal end VDD is higher than the normal high level, the level of the pull-down node PD is relatively higher during the noise reduction phase, thus improving the noise reduction effect. On the basis of this, when the pull-up node PU is at a high level, on the one hand, the fourth switching element T4, the fifth switching element T5 and the sixth switching element T6 can be turned on to pull down the levels of the first pull-down node PD-CN-1, the second pull-down control node PD-CN-2, and the pull-down node PD by the first power signal, and on the other hand, the step-by-step connection of the seventh switching element T7, the eighth switching element T8, and the ninth switching element T9 may attenuate the influence of the second power signal on the pull-down node PD, and thus the low level of the pull-down node PD may be maintained, thus preventing the abnormal output of the shift register unit.

Figure 5:
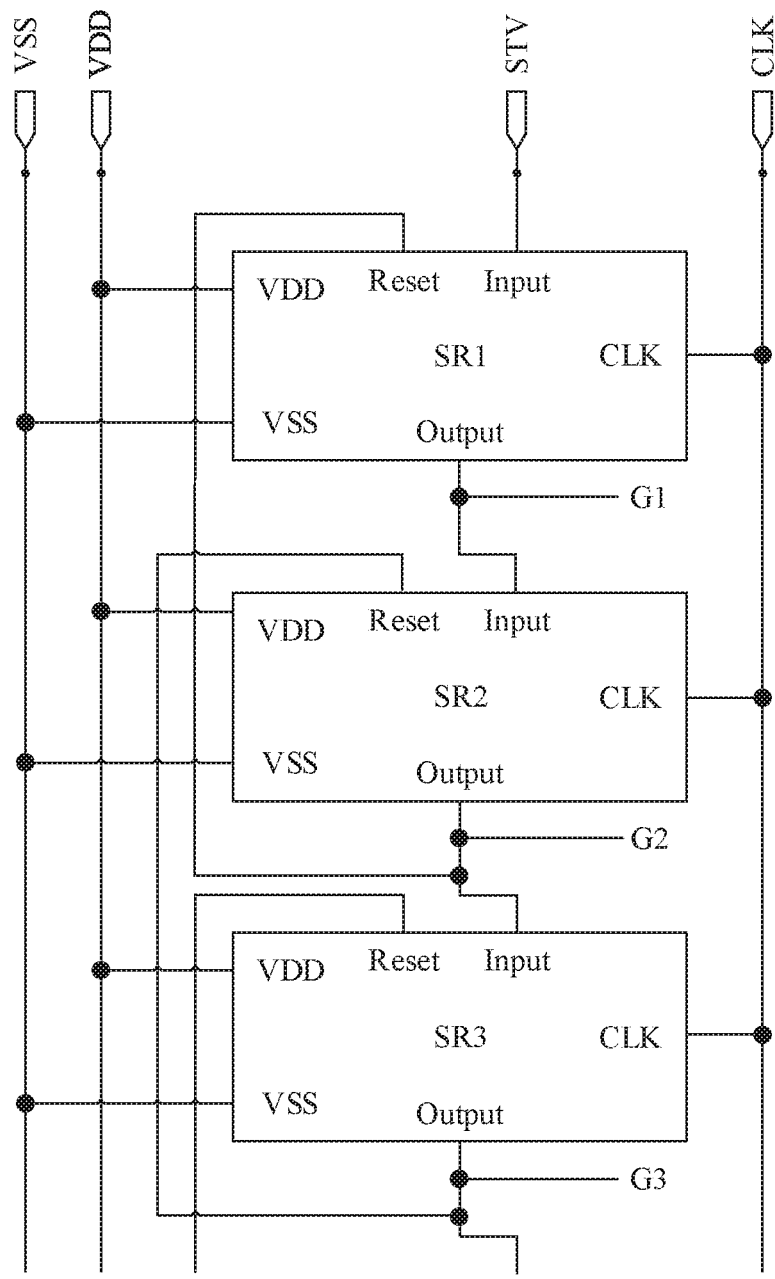
FIG. 5 schematically shows a cascade structure diagram of a shift register circuit in an exemplary arrangement of the present disclosure.

The example arrangement also proposes a shift register circuit that can be used as a gate drive circuit. As shown in FIG. 5, the shift register circuit may include a plurality of cascaded shift register units as described above. In the arrangement, a signal output end Output of the (M−1)-th stage shift register unit is connected to the signal input end Input of the M-th stage shift register unit. The signal output end Output of the (M+1)-th stage shift register unit is connected to the reset signal end Reset of the M-th stage shift register unit.

It should be noted that the specific details of each module, circuit or unit in the shift register circuit have been described in detail in the corresponding shift register unit, and are not described herein again.

The example arrangement also proposes a display panel including a display area and a peripheral area. The peripheral area of the display panel may be provided with the above shift register circuit. The display area of the display panel may include a plurality of gate lines extending in a first direction and a plurality of data lines extending in a second direction intersecting the first direction, and a plurality of pixel units are defined by adjacent gate lines and data lines. In the arrangement, the gate lines are configured to transmit scan signals provided by the shift register circuit, and the data lines are configured to transmit data signals provided by the source drivers. In this arrangement, the first direction may be a horizontal direction, and the second direction may be a vertical direction. However, the present disclosure is not limited thereto, and the first direction and the second direction may also be other directions set according to actual needs.

Based on this, the present arrangement utilizes the GOA technology to integrate the shift register circuit on the periphery of the display panel, thus realizing the design of the narrow bezel panel and reducing the manufacturing cost of the display panel.

In this arrangement, the display panel may be an LCD display panel, an OLED display panel, a PLED (Polymer Light-Emitting Diode) display panel, a PDP (Plasma Display Panel), or the like. There are no specific restrictions on the application of the display panel.

The example arrangement also provides a display device including the above display panel. The display device may include any product or component having a display function, such as a mobile phone, a tablet computer, a television, a notebook computer, a digital photo frame, a navigator, and the like.

In the shift register unit, the shift register circuit and the driving method thereof, and the display panel provided by the exemplary arrangements of the present disclosure, a pull-down control node is added to the conventional shift register unit and the potentials (levels) of the first pull-down control node, the second pull-down control node, and the pull-down node are controlled by the combined action of the first pull-down control circuit and the second pull-down control circuit. In this way, when the pull-up node is at a low level, the function of the first pull-down control circuit can be turned off, and the levels of the first pull-down control node, the second pull-down control node, and the pull-down node are sufficiently raised by the second pull-down control circuit, such that the level of the pull-down node is sufficiently high when the pull-up node is at a low level, thus improving the noise reduction effect; and when the pull-up node is at a high level, the levels of the first pull-down control node, the second pull-down control node and the pull-down node can be pulled down by the first pull-down control circuit, and at the same time, since the second pull-down control circuit implements the control of the levels of the first pull-down control node, the second pull-down control node, and the pull-down node step by step, the pull-down node at the most downstream is least affected by the second power signal, so the low level of the pull-down node can be kept from being pulled up. That is, the level of the pull-down node is kept low enough when the pull-up node is set high, thus preventing an abnormal output of the shift register unit. Based on this, the shift register unit provided by the present disclosure can ensure that the level of the pull-down node is sufficiently high when the pull-up node is set low, and the level of the pull-down node is sufficiently low when the pull-up node is set high, thus ensuring the normal output of the signal and improving the ability of reducing noise.

It should be noted that although several modules, circuits or units of apparatus for action execution are mentioned in the detailed description above, such division is not mandatory. In fact, the features and functions of the two or more modules, circuits or units described above may be embodied in one module, circuit or unit in accordance with the arrangements of the present disclosure. Conversely, the features and functions of a module, circuit or unit described above may be further divided into multiple modules, circuits or units.

In addition, although various blocks of the method of the present disclosure are described in a particular order in the figures, this is not required or implied that the blocks must be performed in the specific order, or all the blocks shown must be performed to achieve the desired result. Additionally or alternatively, certain blocks may be omitted, multiple blocks may be combined into one block execution, and/or one block may be decomposed into multiple block executions and the like.

Through the description of the above arrangements, those skilled in the art will readily understand that the example arrangements described herein may be implemented by software or by software in combination with necessary hardware. Therefore, the technical solution according to an arrangement of the present disclosure may be embodied in the form of a software product, which may be stored in a non-volatile storage medium (which may be a CD-ROM, a USB flash drive, a mobile hard disk, etc.) or on a network. A number of instructions are included to cause a computing device (which may be a personal computer, server, mobile terminal, or network device, etc.) to perform a method in accordance with an arrangement of the present disclosure.

Other arrangements of the present disclosure will be apparent to those skilled in the art by considering the specification or implementing the technical solution disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and examples are to be regarded as illustrative only, and the true scope and spirit of the disclosure are indicated by the appended claims.

What is claimed is:

1. A shift register, comprising:
    an input circuit, connected to a signal input end and a pull-up node, and configured to transmit an input signal to the pull-up node under control of the signal input end;
    a reset circuit, connected to a reset signal end, a first power signal end, and the pull-up node, and configured to transmit a first power signal to the pull-up node under control of the reset signal end;
    an output circuit, connected to the pull-up node, a clock signal end, and a signal output end, and configured to transmit a clock signal to the signal output end under control of the pull-up node;
    a first pull-down control circuit, connected to the pull-up node, the first power signal end, a first pull-down control node, a second pull-down control node, and a pull-down node, and configured to respectively transmit the first power signal to the first pull-down control node, the second pull-down control node, and the pull-down node, under control of the pull-up node;
    a second pull-down control circuit, connected to a second power signal end, the first pull-down control node, the second pull-down control node, and the pull-down node, and configured to transmit a second power signal to the first pull-down control node under control of the second power signal end, transmit the second power signal to the second pull-down control node under control of the first pull-down control node, and transmit the second power signal to the pull-down node under control of the second pull-down control node; and
    a pull-down circuit, connected to the pull-down node, the first power signal end, the pull-up node, and the signal output end, and configured to respectively transmit the first power signal to the pull-up node and the signal output end under control of the pull-down node.

2. The shift register according to claim 1, wherein the input circuit comprises:
    a first switching element, having a control end and a first end connected to the signal input end, and a second end connected to the pull-up node.

3. The shift register according to claim 2, wherein each of the first switching element is an N-type transistor or a P-type transistor.

4. The shift register according to claim 2, wherein a level of the second power signal is higher than those of other signals.

5. The shift register according to claim 1, wherein the reset circuit comprises:
a second switching element, having a control end connected to the reset signal end, a first end connected to the first power signal end, and a second end connected to the pull-up node.

6. The shift register according to claim 1, wherein the output circuit comprises:
a third switching element having a control end connected to the pull-up node, a first end connected to the clock signal end, and a second end connected to the signal output end; and
a storage capacitor coupled between the pull-up node and the signal output end.

7. The shift register according to claim 1, wherein the first pull-down control circuit comprises:
a fourth switching element having a control end connected to the pull-up node, a first end connected to the first power signal end, and a second end connected to the first pull-down control node;
a fifth switching element having a control end connected to the pull-up node, a first end connected to the first power signal end, and a second end connected to the second pull-down control node; and
a sixth switching element having a control end connected to the pull-up node, a first end connected to the first power signal end, and a second end connected to the pull-down node.

8. The shift register according to claim 1, wherein the second pull-down control circuit comprises:
a seventh switching element having a control end and a first end connected to the second power signal end, and a second end connected to the first pull-down control node;
an eighth switching element having a control end connected to the first pull-down control node, a first end connected to the second power signal end, and a second end connected to the second pull-down control node;
a ninth switching element having a control end connected to the second pull-down control node, a first end connected to the second power signal end, and a second end connected to the pull-down node.

9. The shift register according to claim 1, wherein the pull-down circuit comprises:
a tenth switching element having a control end connected to the pull-down node, a first end connected to the first power signal end, and a second end connected to the pull-up node;
an eleventh switching element having a control end connected to the pull-down node, a first end connected to the first power signal end, and a second end connected to the signal output end.

10. A shift register circuit comprising a plurality of cascaded shift register units, each shift register unit comprising:
an input circuit, connected to a signal input end and a pull-up node, and configured to transmit an input signal to the pull-up node under control of the signal input end;
a reset circuit, connected to a reset signal end, a first power signal end, and the pull-up node, and configured to transmit a first power signal to the pull-up node under control of the reset signal end;
an output circuit, connected to the pull-up node, a clock signal end, and a signal output end, and configured to transmit a clock signal to the signal output end under control of the pull-up node;
a first pull-down control circuit, connected to the pull-up node, the first power signal end, a first pull-down control node, a second pull-down control node, and a pull-down node, and configured to respectively transmit the first power signal to the first pull-down control node, the second pull-down control node, and the pull-down node, under control of the pull-up node;
a second pull-down control circuit, connected to a second power signal end, the first pull-down control node, the second pull-down control node, and the pull-down node, and configured to transmit a second power signal to the first pull-down control node under control of the second power signal end, transmit the second power signal to the second pull-down control node under control of the first pull-down control node, and transmit the second power signal to the pull-down node under control of the second pull-down control node;
a pull-down circuit, connected to the pull-down node, the first power signal end, the pull-up node, and the signal output end, and configured to respectively transmit the first power signal to the pull-up node and the signal output end under control of the pull-down node;
the signal output end of the (M−1)-th stage shift register unit is connected to the signal input end of the M-th stage shift register unit; and
the signal output end of the (M+1)-th stage shift register unit is connected to the reset signal end of the M-th stage shift register unit.

11. A display panel comprising a display area and a peripheral area; and the peripheral area being provided with the shift register circuit according to claim 10.

12. The display panel according to claim 11, further comprising:
a plurality of gate lines extending in a first direction and a plurality of data lines extending in a second direction intersecting the first direction; and a plurality of pixel units defined by the gate lines and the data lines:
wherein each of the gate lines is configured to transmit a scan signal provided by the shift register circuit, and each of the data lines is configured to transmit a data signal provided by a source driver.

13. A driving method for driving the shift register circuit according to claim 10, comprising:
in a charging phase, the input circuit is controlled to be turned on by the input signal to transmit the input signal to the pull-up node, and the first pull-down control circuit is controlled to be turned on by the pull-up node to respectively transmit the first power signal to the first pull-down control node, the second pull-down control node, and the pull-down node;
in an output stage, the first pull-down control circuit and the output circuit are controlled to be turned on by the pull-up node to respectively transmit the first power signal to the first pull-down control node, the second pull-down control node, and the pull-down node, and transmitting the clock signal to the signal output end;
in a discharging phase, the first pull-down control circuit is controlled to be turned on by the pull-up node to maintain voltages of the first pull-down control node, the second pull-down control node, and the pull-down node; and
in a reset phase, the reset circuit is controlled to be turned on by a reset signal to transmit the first power signal to the pull-up node, and the second pull-down control circuit is controlled to be turned on by the second power signal to respectively transmit the second power signal to the first pull-down control node, the second pull-down control node, and the pull-down node, and controlling the pull-down circuit to be turned on by the pull-down node to respectively transmit the first power signal to the pull-up node and the signal output end.

* * * * *